US012681108B1

(12) United States Patent
Ferré Fàbregas et al.

(10) Patent No.: US 12,681,108 B1
(45) Date of Patent: Jul. 14, 2026

(54) ELECTRICAL ASSEMBLY AND METHOD

(71) Applicant: Lear Corporation, Southfield, MI (US)

(72) Inventors: Antoni Ferré Fàbregas, Valls (ES); Jose Juan Hidalgo, Sant Pere de Ribes (ES); Carlos Fernandez Pueyo, Reus (ES)

(73) Assignee: Lear Corporation, Southfield, MI (US)

( * ) Notice: Subject to any disclaimer, the term of this patent is extended or adjusted under 35 U.S.C. 154(b) by 0 days.

(21) Appl. No.: 19/056,219

(22) Filed: Feb. 18, 2025

(51) Int. Cl.
*G01R 31/58* (2020.01)
*B60R 16/033* (2006.01)

(52) U.S. Cl.
CPC ............ *G01R 31/58* (2020.01); *B60R 16/033* (2013.01)

(58) Field of Classification Search
CPC ......... G01R 31/58; G01R 31/72; G01R 31/59
See application file for complete search history.

(56) References Cited

U.S. PATENT DOCUMENTS

| | | | |
|---|---|---|---|
| 4,104,581 A | 8/1978 | Arkosy | |
| 5,268,644 A | 12/1993 | Klassen | |
| 6,215,313 B1 | 4/2001 | Lewandowski | |

| | | | |
|---|---|---|---|
| 6,225,811 B1 | 5/2001 | Bruning | |
| 9,977,065 B2 | 5/2018 | Miret | |
| 2007/0114956 A1* | 5/2007 | Hashimoto | ............... H02P 4/00 318/139 |
| 2015/0160281 A1* | 6/2015 | Zaki | ........................ B60L 53/60 324/543 |
| 2015/0212025 A1 | 7/2015 | Francis-Buller | |
| 2017/0146587 A1* | 5/2017 | Jurisch | ................. G01R 31/088 |
| 2017/0199237 A1* | 7/2017 | Dzienis | ............... G01R 31/088 |
| 2024/0208443 A1* | 6/2024 | Bierwirth | ............. G01R 31/086 |

FOREIGN PATENT DOCUMENTS

KR        200383776 Y1      5/2005

* cited by examiner

*Primary Examiner* — Menatoallah Youssef
*Assistant Examiner* — Esayas G Yeshaw
(74) *Attorney, Agent, or Firm* — McGarry Bair PC

(57) ABSTRACT

A method of operating an electrical assembly comprising: sensing a current of a wire assembly electrically connecting a controller assembly with an electronic control unit (ECU), the wire assembly including a wire; sampling, at the controller assembly, a wire voltage of the wire to obtain a first set of voltage measurements; providing, via the controller assembly, a sampling request to the ECU; sampling, at the ECU and in accordance with receiving the sampling request, the wire voltage of the wire to obtain a second set of voltage measurements; providing the second set of voltage measurements to the controller assembly; compensating for a delay between the controller assembly and the ECU by shifting the first set of voltage measurements or the second set of voltage measurements by a time shift.

20 Claims, 4 Drawing Sheets

ELECTRICAL ASSEMBLY AND METHOD

TECHNICAL FIELD

The present disclosure generally relates to electrical assemblies, including electrical assemblies that can, for example, be utilized in connection with vehicles.

BRIEF DESCRIPTION OF THE DRAWINGS

While the claims are not limited to a specific illustration, an appreciation of various aspects may be gained through a discussion of various examples. The drawings are not necessarily to scale, and certain features may be exaggerated or hidden to better illustrate and explain an innovative aspect of an example. Further, the exemplary illustrations described herein are not exhaustive or otherwise limiting, and embodiments are not restricted to the precise form and configuration shown in the drawings or disclosed in the following detailed description. Exemplary illustrations are described in detail by referring to the drawings as follows:

DETAILED DESCRIPTION

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

Figure 1:
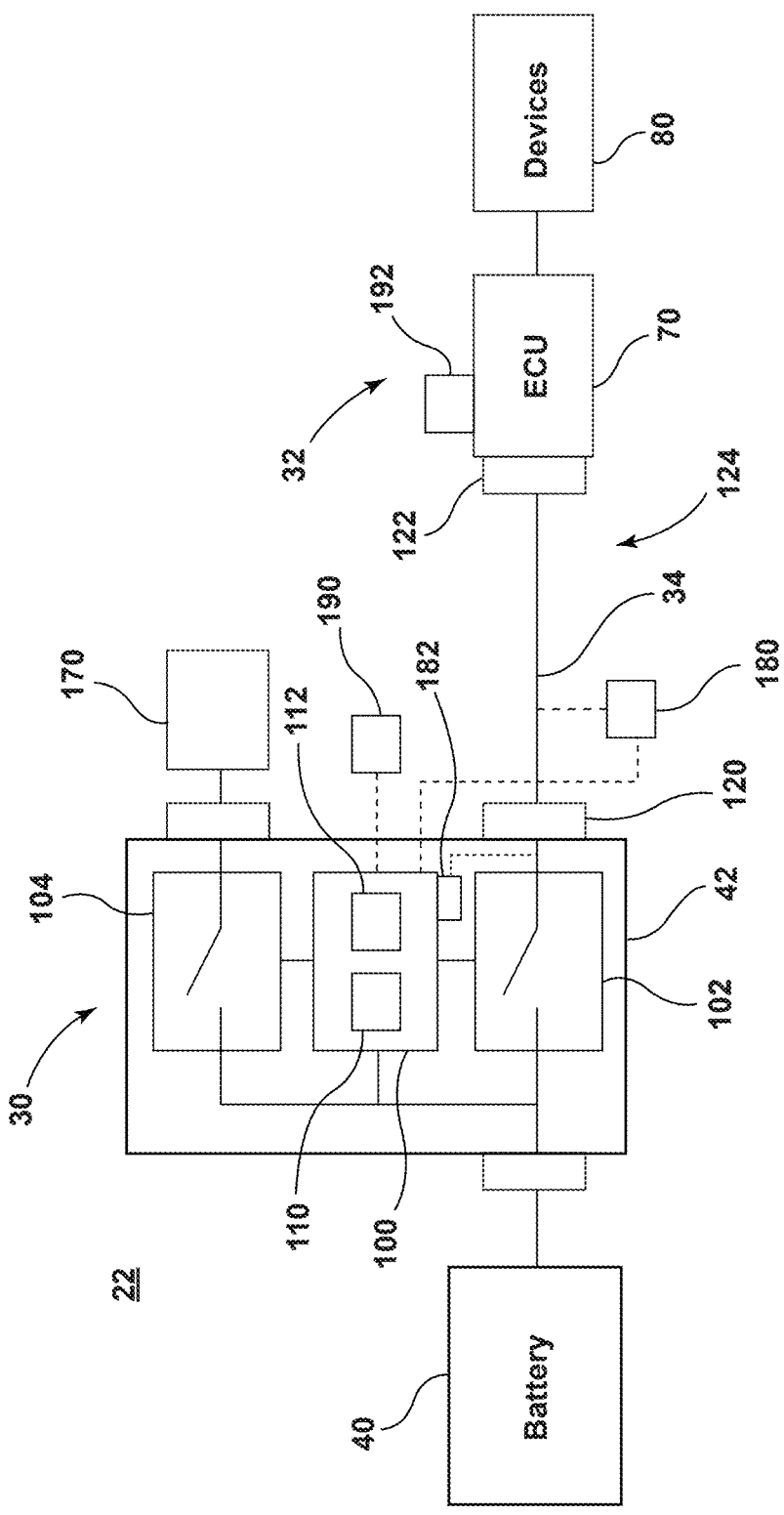
FIG. 1 is a schematic view generally illustrating an embodiment of an electrical assembly in a vehicle according to teachings of the present disclosure.

Referring to FIG. 1, an electrical assembly 20 includes a controller assembly 30, a load assembly 32, and a wire 34 electrically connecting the controller assembly 30 with the load assembly 32. The electrical assembly 20 is illustrated in a vehicle 22 but is not limited to vehicle applications. The controller assembly 30 is electrically connected with a battery 40, such as of the vehicle 22. The battery 40 is configured to provide an output voltage. The output voltage is optionally 12 V, 24 V, or 48V. Optionally, the controller assembly 30 includes a controller assembly housing 42, and the wire 34 extends from the controller assembly housing 42 to the load assembly 32. Optionally, the controller assembly 30 is provided as a smart power distribution box (SPDM).

The load assembly 32 includes an electronic control unit (ECU) 70 and an electrical device 80 (e.g., an electrical load) connected to the ECU 70. Optionally, the ECU 70 is a vehicle seat ECU. Optionally, the electrical device 80 comprises one or more vehicle electrical devices, such as seat motors, heaters, fans, lights, controllers, antennas, other devices, or combinations thereof.

The controller assembly 30 includes a controller 100 (e.g., an electronic controller), a first switch 102, and/or a second switch 104, some or all of which are electrically connected to the battery 40. The first switch 102 and/or the second switch 104 can include one or more of a variety of configurations, such as a transistor (e.g., a metal-oxide-semiconductor field-effect transistor (MOSFET)), a relay, a contactor, other switch configurations, or combinations thereof. The controller 100 includes a processor 110 and a memory 112, and is configured to control operation of (e.g., open and close) the first switch 102 and/or the second switch 104. For example, the controller 100 is electrically connected to the first switch 102 and the second switch 104. While illustrated with two switches, the controller assembly 30 can include a single switch or more than one switch. The first switch 102 is electrically connected to the load assembly 32, such as via the wire 34. Optionally, the wire 34 is electrically connected to the controller assembly 30 via a first connector 120 (e.g., a first electrical connector) and/or is electrically connected to the load assembly 32 via a second connector 122 (e.g., a second electrical connector). The first connector 120 is, for example, provided at or connected to an outer surface of the controller assembly housing 42. The second connector 122 is, for example, provided at or connected to an outer surface of load assembly 32 and/or the ECU 70. A wire assembly 124 includes the wire 34, the first connector 120, and/or the second connector 122.

The second switch 104 is electrically connected to one or more other components 170, which optionally include one or more second load assemblies. For example, the controller 100 can control, at least in part, the load assembly 32 and the one or more second load assemblies, such as via respective switches (e.g., the first switch 102, the second switch 104).

The controller 100 is configured to monitor one or more parameters of the wire 34, such as to determine a degradation status of the wire 34. The one or more parameters of the wire 34 can include a voltage at the wire 34, a current in the wire 34, or both, among others. A current sensor 180 can be connected to the wire 34 directly, can be incorporated into the controller assembly 30, can be incorporated into the first switch 102, and/or can be incorporated into the ECU 70. For example, the first switch 102 optionally includes an electronic fuse that monitors the current at the first switch 102, which is equal (or sufficiently close to equal) to the current in the wire 34. A first voltage sensor 182 can be connected to the wire 34 directly, can be incorporated into the controller assembly 30, and/or incorporated into the controller 100. For example, the controller 100 can sample the voltage of the wire 34 at the controller assembly 30 via the first voltage sensor to obtain a first set of voltage measurements 200 (FIG. 2).

Optionally, the controller 100 is configured to determine whether the electrical assembly 20 is in a stopped state, such as via a stop sensor 190. The stop sensor 190 includes, for example, a park sensor of the vehicle 22 that provides an indication of the vehicle 22 being in park (e.g., with the parking brake set, with a transmission in park, being at a parking location, others).

The load assembly 32 includes a second voltage sensor 192 that is electrically connected to and/or incorporated with the ECU 70 obtain the voltage in the wire 34 at the ECU 70. For example, the ECU 70 can sample the voltage of the wire 34 at the ECU 70 via the second voltage sensor to obtain a second set of voltage measurements 202 (FIG. 3). Some or all of the second set of voltage measurements are different than the first set of voltage measurements. The controller 100 sends a sampling request to the ECU 70 for the ECU 70 to conduct the sampling to obtain the second set of voltage measurements. The sampling request includes a number of samples and a sampling rate, which match a number of samples and a sampling rate utilized by the controller 100 to obtain the first set of voltage measurements 200.

Figures 2, 3:
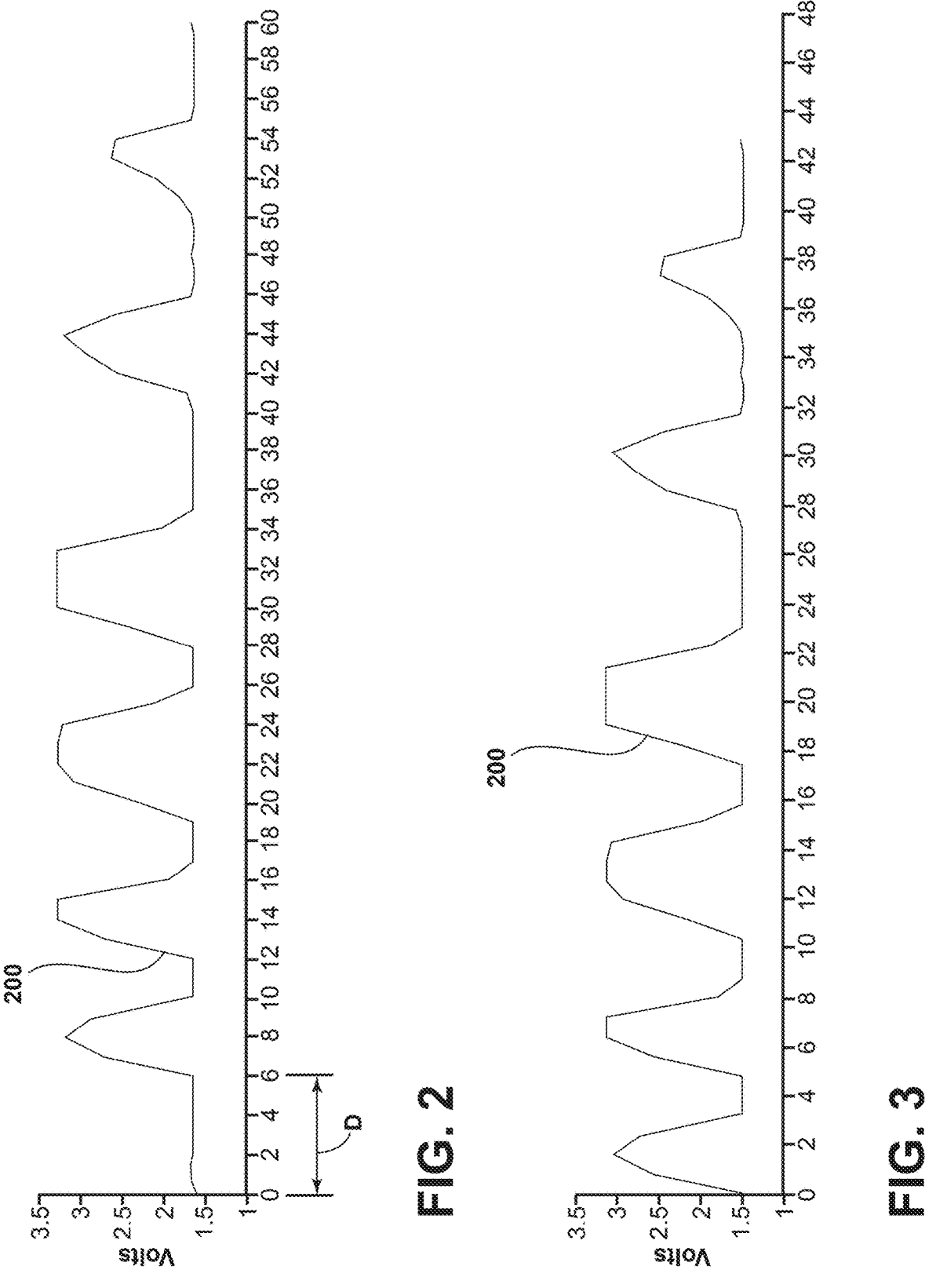
FIG. 2 is a chart generally illustrating a first set of voltage measurements associated with an embodiment of an electrical assembly according to teachings of the present disclosure.
FIG. 3 is a chart generally illustrating a second set of voltage measurements associated with an embodiment of an electrical assembly according to teachings of the present disclosure.

Referring to FIGS. 2 and 3, examples of the first set of voltage measurements 200 and the second set of voltage measurements 202, respectively, are illustrated in charts of voltage relative to time. The first set of voltage measurements 200 are obtained at the controller assembly 30 (e.g., at a first end of the wire 34) and the second set of voltage measurements 202 are obtained at the ECU 70 (e.g., at a second end of the wire 34). The controller 100 can utilize differences in magnitude between the first and second sets of voltage measurements 200, 202 (e.g., voltage differences/ drops) to determine degradation of the wire 34. In at least some circumstances, the controller 100 and the ECU 70 are not synchronized, such as via a common clock signal, so there can be a delay D between when the controller 100 obtains the first set of voltage measurements 200 and when the ECU 70 obtains the second set of voltage measurements 202, which can make comparing the first set of voltage measurements 200 with the second set of voltage measurements 202 challenging. For example, it may, additionally or alternatively, be impractical to obtain accurate time stamps for each sample. The delay D can correspond to a communication data bus speed between the controller 100 and the ECU 70, for example. The controller 100 can compensate for the delay D.

Compensating for the delay D includes the controller 100 shifting the first set of voltage measurements 200 or the second set of voltage measurements 202 by a time shift such that a total difference in magnitude between the first and second sets of voltage measurements 200, 202 is minimized, which includes time shifting one or both of the first and second sets of voltage measurements 200, 202 by a time shift. The controller 100 determines the time shift, for example, via iteratively shifting one of the first and second sets of voltage measurements 200, 202 by an increment (e.g., the sample period) and determining a respective total difference in magnitude for each shift. The controller 100 determines the total differences in magnitude, for example, by determining a sum of the absolute values of the differences in magnitude at each sample time. Optionally, the controller 100, additionally or alternatively, determines the total difference in magnitude according to the following equation:

$$d = \frac{1}{n}\sqrt{\sum_{i-1}^{n}|x_i - y_i|^2} \qquad \text{Eq. 1}$$

where d equals the total difference in magnitude, n equals the number of samples, x equals the magnitude of a respective voltage measurement of the first set of voltage measurements 200, and y equals the magnitude of a respective voltage measurement of the second set of voltage measurements 202.

The controller 100 determines the time shift according to a difference between the original time of the shifted set and the time at which the total difference in magnitude is minimized. The time shift corresponds to (e.g., is substantially equal to) the delay D.

Figures 4, 5:
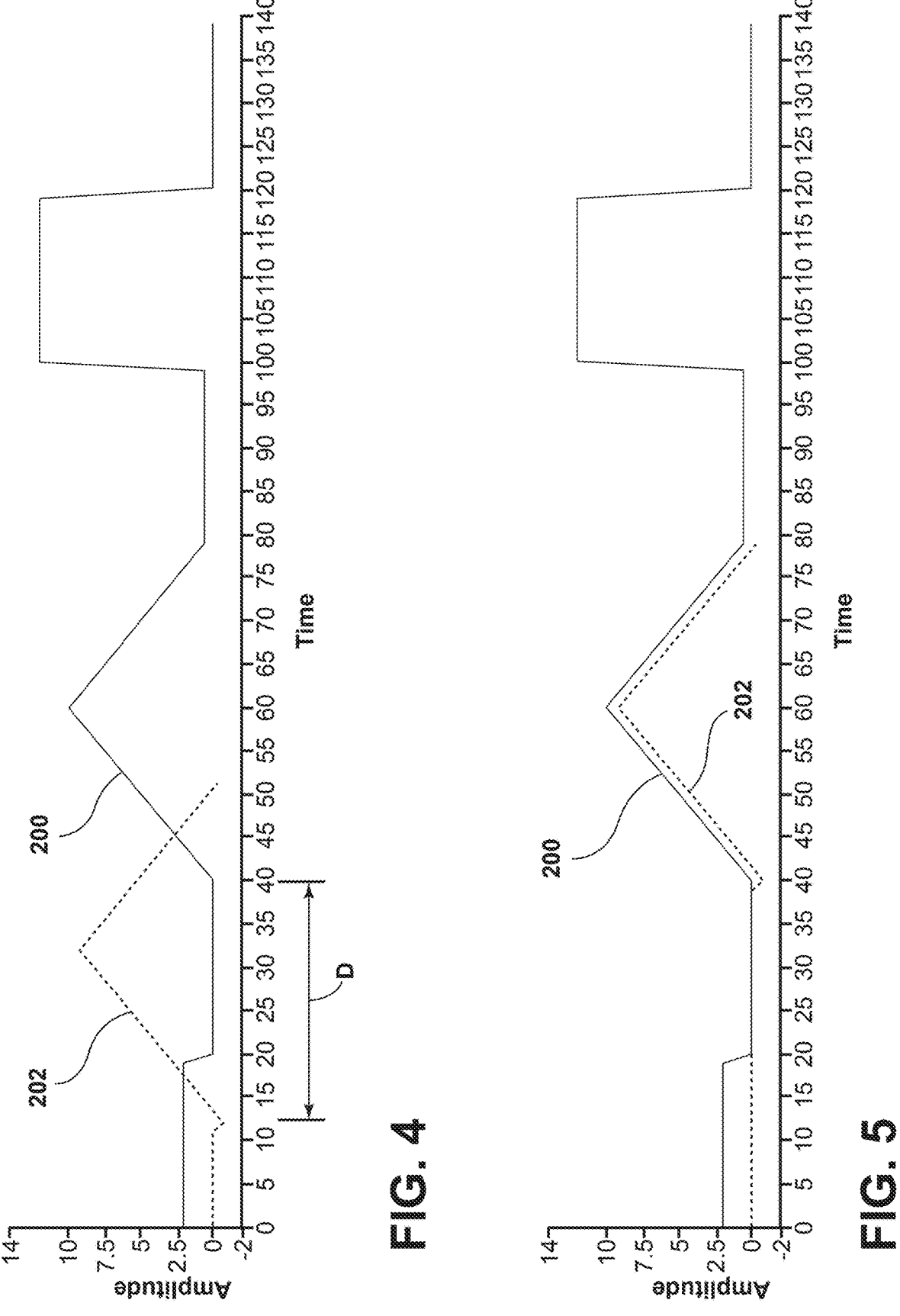
FIG. 4 is a chart generally illustrating a first set of voltage measurements and a second set of voltage measurements associated with an embodiment of an electrical assembly, prior to compensating for a delay, according to teachings of the present disclosure.
FIG. 5 is a chart generally illustrating a first set of voltage measurements and a second set of voltage measurements associated with an embodiment of an electrical assembly in a vehicle, after compensating for a delay, according to teachings of the present disclosure.

Referring to FIG. 4, additional examples of the first set of voltage measurements 200 and the second set of voltage measurements 202 are illustrated in a chart of voltage relative to time and are offset by the delay D, prior to the controller 100 compensating for the delay D. Referring to FIG. 5, the first set of voltage measurements 200 and the second set of voltage measurements 202 are illustrated in a chart of voltage relative to time after the controller 100 has compensated for the delay D by shifting the second set of voltage measurements 202 forward by the time shift.

The controller 100 is configured to determine a resistance of the wire 34 and/or the wire assembly 124. For example, after compensating for the delay to obtain the difference in magnitude that is minimized, the controller 100 divides that minimized difference in magnitude by the current of the wire assembly 124 (e.g., obtains a quotient of the difference in magnitude and the current). The controller 100 is configured to operate the first switch 102 according to the determined resistance. For example, the controller 100 compares the determined resistance to a threshold resistance, and, in accordance with the resistance being greater than the threshold resistance, the controller 100 opens the first switch 102 to disconnect the wire assembly 124, including the wire 34, and the electrical device 80 from the controller assembly 30 and/or the battery. The threshold resistance, for example, corresponds to an expected level of degradation of the wire 34 that exceeds a maximum and/or at which performance of the wire 34 is expected to be below a minimum level.

While described with the controller 100 compensating for the delay D and determining the resistance of the wire 34, the ECU 70 can, additionally or alternatively, compensate for the delay, which can include receiving the first set of voltage measurements 200 from the controller 100, and/or determine the resistance.

Figure 6:
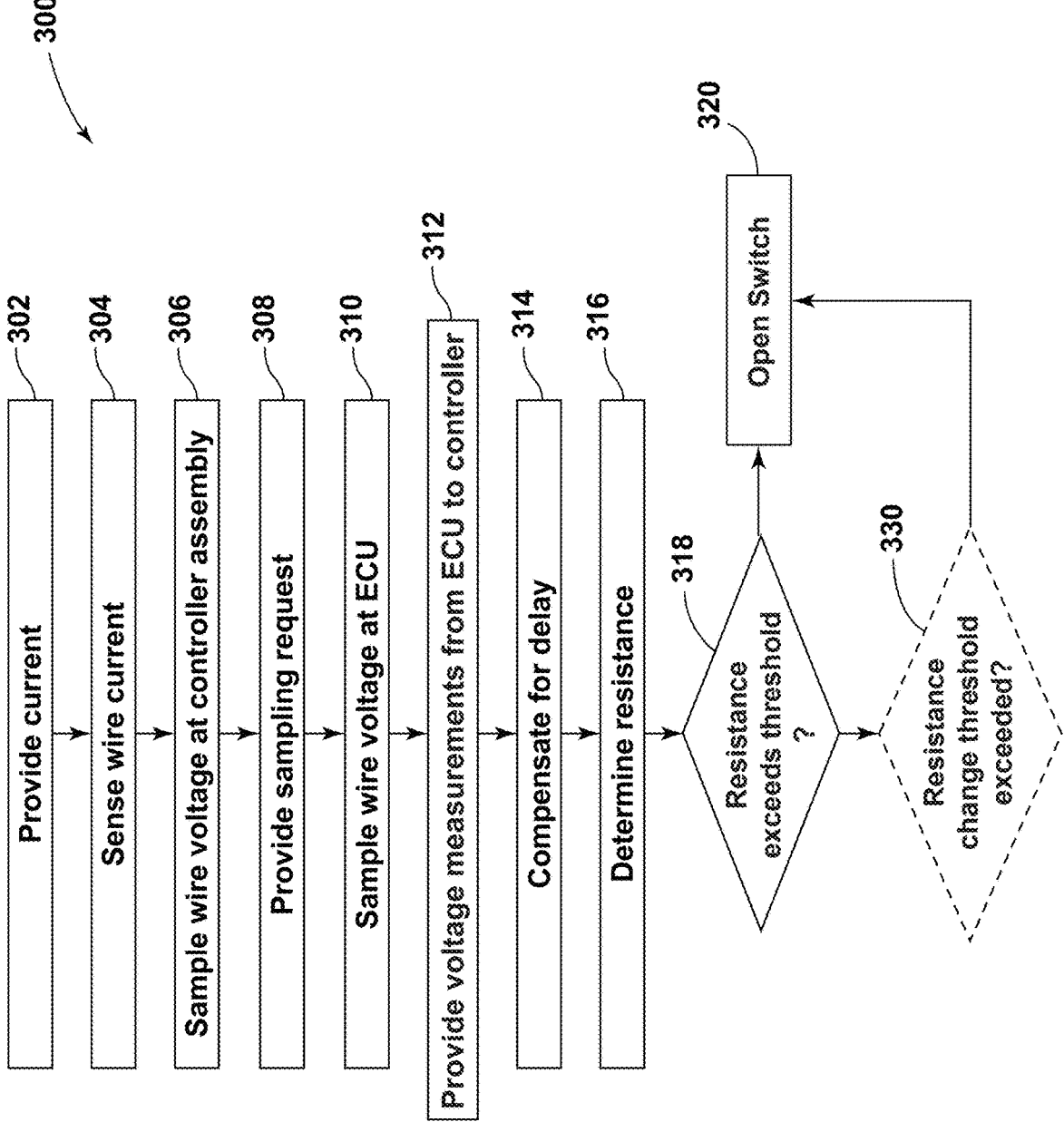
FIG. 6 is a flow diagram generally illustrating an embodiment of a method of operating an electrical assembly according to teachings of the present disclosure.

Referring to FIG. 6, a method 300 of operating an electrical assembly is illustrated that can, for example, be utilized in connection with the electrical assembly 20 and/or the vehicle 22 illustrated in FIG. 1. The method 300 includes providing electrical current from the battery 40 through the controller assembly 30 (e.g., through the first switch 102), the wire 34, and the load assembly (block 302). Providing the electrical current through the controller assembly 30 includes the controller 100 closing the first switch 102 to electrically connect the load assembly 32 with the battery 40 via the wire 34. The method 300 includes sensing the current of the wire assembly 124 (e.g., of the wire 34) (block 304), which can include the current sensor 180 sensing the current and the controller assembly 30 obtaining the current and/or information corresponding to the current, from the current sensor 180. The method 300 includes sampling, at the controller assembly 30, the wire voltage of the wire 34 to obtain the first set of voltage measurements (block 306). The sampling is conducted at the sampling frequency and includes obtaining the number of samples.

The method 300 includes providing, via the controller assembly 30, the sampling request to the ECU 70 (block 308). The sampling request includes the sampling frequency and the number of samples to obtain. The method 300 includes sampling, at the ECU 70 and in accordance with receiving the sampling request, the wire voltage of the wire 34 to obtain the second set of voltage measurements 202 (block 310). The method 300 includes the ECU 70 providing the second set of voltage measurements 202 to the controller 100 (block 312)

The method 300 includes compensating for the delay between the controller assembly 30 and the ECU 70 (e.g., between the first set of voltage measurements 200 and the second set of voltage measurements 202) (block 314). Compensating for the delay in block 310 can include the controller 100 shifting the first set of voltage measurements 200 or the second set of voltage measurements 202 by the time shift, which can include shifting both of the first and second sets of voltage measurements 200, 202 by portions of the time shift (e.g., shifting the first set of voltages measurements 200 back by a portion of the time shift and shifting the second set of voltage measurements 202 forward by the remaining portion of the time shift). The controller 100 can conduct the shifting such that the total difference in magnitude between the first set of voltage measurements and the second set of voltage measurements is minimized.

The method 300 includes determining, at the controller assembly 30 after compensating for the delay in block 314, a resistance of the wire 34 and/or the wire assembly 124 (block 316), such as according to the difference in magnitude divided by the current of the wire assembly 124. The method 300 includes comparing the determined resistance with the threshold resistance (block 318), and, in accordance with the resistance being greater than or equal to the threshold resistance, the controller 100 opening a switch (e.g., the first switch 102) (block 320), such as to disconnect the wire 34, the wire assembly 124, and/or the electrical device 80 from the controller assembly 30 and/or from the battery 40. For example, the controller assembly 30 can determine that the wire assembly 124 (e.g., the wire 34) is defective in accordance with determining that the resistance is greater than or equal to the threshold resistance The time delay between the controller 100 and the ECU 70 can vary over time. Optionally, the method 300 includes repeating one or more of blocks 304-318, such as to compensate for a second time delay between the controller 100 and the ECU 70. For example, the method 300 can include repeating block 304 to sensing a second current of the wire assembly 124, repeating the sampling at the controller assembly 30 of block 306 to obtain a third set of voltage measurements, repeating block 308 to provide a second sampling request from the controller 100 to the ECU 70, repeating the sampling at the ECU 70 of block 310 to obtain a fourth set of voltage measurements, repeating block 312 to provide the fourth set of voltage measurements to the controller 100, repeating block 314 to compensate, via the controller 100, for the second delay between the controller assembly 30 and the ECU 70. Compensating for the second delay includes, for example, the controller 100 shifting the third set of voltage measurements or the fourth set of voltage measurements by a second time shift such that a second difference in magnitude between the third set of voltage measurements and the fourth set of voltage measurements is minimized.

Optionally, the method 300 includes repeating block 316 to determine, via the controller 100 and after compensating for the second delay, a second resistance of the wire 34 and/or the wire assembly 124, such as according to the second difference in magnitude divided by the second current. Optionally, the method 300 further comprises, repeating block 318 to compare the second resistance with the threshold resistance, and, in accordance with the second resistance being greater than or equal to the threshold resistance, the controller 100 opening the switch (e.g., the first switch 102) in block 320. For example, the controller 100 opens the switch if either of the resistance or the second resistance exceeds the resistance threshold.

Optionally, the method 300 further comprises utilizing the determined resistance from block 316 as an initial resistance and comparing the initial resistance to the second resistance to determine if a resistance change between the initial resistance and the second resistance exceeds a resistance change threshold (block 330). In accordance with the resistance change being greater than or equal to the resistance change threshold, the controller 100 opens the switch (block 320).

Optionally, the controller assembly 30 operates the vehicle 22, at least in part, in accordance with the controller 100 opening the switch. For example, the controller assembly 30 operates the vehicle 22 without operating the electrical device 80.

Optionally, the controller assembly 30 is configured to initiate and/or conduct the method 300 in response to receiving an indication that the ECU 70 and/or the electrical device 80 are active or are being activated. Optionally, the controller assembly 30 initiates and/or conducts the method 300 only when the ECU 70 and/or the electrical device 80 are active.

Some or all of the blocks of the method 300 can be conducted, at least in part, via the controller assembly 30, such as via the controller 100, and/or via the ECU 70.

Determining a resistance, such as the resistance of the wire assembly 124, can include determining the resistance, the impedance, or both the resistance and the impedance.

The instant disclosure includes the following non-limiting embodiments:

A method of operating an electrical assembly, the method comprising: sensing a current of a wire assembly electrically connecting a controller assembly with an electronic control unit (ECU), the wire assembly including a wire; sampling, at the controller assembly, a wire voltage of the wire to obtain a first set of voltage measurements; providing, via the controller assembly, a sampling request to the ECU; sampling, at the ECU and in accordance with receiving the sampling request, the wire voltage of the wire to obtain a second set of voltage measurements; providing the second set of voltage measurements to the controller assembly; compensating for a delay between the controller assembly and the ECU by shifting the first set of voltage measurements or the second set of voltage measurements by a time shift such that a difference in magnitude of the first set of voltage measurements and the second set of voltage measurements is minimized; and determining, at the controller assembly, a resistance of the wire assembly according to a quotient of the difference in magnitude divided by the current.

The method of any preceding embodiment, wherein the wire assembly includes a first electrical connector coupled to the wire and the controller assembly and a second electrical connector coupled to the wire and the ECU.

The method of any preceding embodiment, wherein the shifting includes shifting the second set of measurements forward by the time shift.

The method of any preceding embodiment, wherein the sampling request includes a number of samples and a sampling rate.

The method of any preceding embodiment, wherein the sampling at the controller assembly includes obtaining the number of samples at the sampling rate; and the sampling at the controller assembly includes obtaining the number of samples at the sampling rate.

The method of any preceding embodiment, wherein the difference in magnitude is equal to a sum of differences in magnitude for each of the first set of voltage measurements relative to the second set of voltage measurements.

The method of any preceding embodiment, further comprising: comparing the resistance with a threshold resistance; and in accordance with determining the resistance is greater than or equal to the threshold resistance, opening a switch to disconnect the wire assembly from the controller assembly.

The method of any preceding embodiment, further comprising: repeating the sampling at the controller assembly to obtain a third set of voltage measurements, the sampling at the ECU to obtain a fourth set of voltage measurements; and compensating for a second delay between the controller assembly and the ECU by shifting the third set of voltage measurements or the fourth set of voltage measurements by a second time shift such that a second difference in magnitude of the third set of voltage measurements and the fourth set of voltage measurements is minimized.

The method of any preceding embodiment, further comprising: sensing a second current of the wire assembly; and determining, after compensating for the second delay, a second resistance of the wire assembly according to a second quotient of the second difference in magnitude divided by the second current.

The method of any preceding embodiment, wherein the second time shift is different than the time shift.

The method of any preceding embodiment, further comprising utilizing the determined resistance as an initial resistance; and comparing the initial resistance and the second resistance to determine if a resistance change has exceeded a resistance change threshold.

The method of any preceding embodiment, further comprising, in accordance with determining that the resistance change has exceeded the resistance change threshold, opening a switch of the controller assembly to disconnect the wire from the controller assembly.

The method of any preceding embodiment, wherein opening the switch disconnects the wire and the ECU from a battery.

The method of any preceding embodiment, further comprising: comparing the resistance to a threshold resistance; comparing the second resistance to the threshold resistance; and in accordance with determining the resistance or the second resistance is greater than or equal to the threshold resistance, opening a switch to disconnect the wire assembly from the controller assembly.

The method of any preceding embodiment, wherein controller assembly and the ECU are not synchronized with each other.

An electrical assembly, comprising: a controller assembly including an electronic controller and a switch; an electronic control unit (ECU); and a wire assembly including a wire and electrically connecting the controller assembly with the electronic control unit; wherein the controller assembly is configured to: obtain a current of the wire assembly; sample a wire voltage of the wire to obtain a first set of voltage measurements; provide a sampling request to the ECU; and compensate for a delay between the controller assembly and the ECU; and wherein the ECU is configured to: sample, in accordance with receiving the sampling request, the wire voltage of the wire to obtain a second set of voltage measurements; and provide the second set of voltage measurements to the controller assembly.

The electrical assembly of any preceding embodiment, wherein compensating for the delay between the controller assembly and the ECU includes shifting the first set of voltage measurements or the second set of voltage measurements by a time shift such that a difference in magnitude of the first set of voltage measurements and the second set of voltage measurements is minimized.

The electrical assembly of any preceding embodiment, wherein the controller assembly is configured to determine whether the wire assembly is defective.

The electrical assembly of any preceding embodiment, wherein determining whether the wire assembly is defective includes determining a resistance of the wire assembly according to a quotient of the difference in magnitude divided by the current.

A vehicle, comprising: a battery; an electrical load; and the electrical assembly of any preceding embodiment; wherein the controller assembly is electrically connected to the battery, and the ECU is electrically connected to the electrical load.

The method of any preceding embodiment, wherein the controller assembly and the ECU are unsynchronized relative to each other.

The method of any preceding embodiment, wherein the shifting includes shifting the first set of voltage measurements back by the time shift.

The method of any preceding embodiment, wherein the shifting includes shifting the first set of voltage measurements back by a portion of the time shift and shifting the second set of voltage measurements forward by a remaining portion of the time shift.

A vehicle comprising the assembly of any preceding embodiment.

An electronic controller configured to implement the method of any preceding embodiment.

A vehicle comprising the controller assembly of any preceding embodiment.

A non-transitory computer-readable storage medium having a computer program encoded thereon for implementing the method of any preceding embodiment.

A vehicle comprising the non-transitory computer-readable storage medium of any preceding embodiment.

In examples, a controller (e.g., the controller 100, the ECU 70) may include an electronic controller and/or include an electronic processor, such as a programmable microprocessor and/or microcontroller. In embodiments, a controller may include, for example, an application specific integrated circuit (ASIC) and/or an embedded controller. A controller may include a central processing unit (CPU), a memory (e.g., a non-transitory computer-readable storage medium), and/or an input/output (I/O) interface. A controller may be configured to perform various functions, including those described in greater detail herein, with appropriate programming instructions and/or code embodied in software, hardware, and/or other medium. In embodiments, a controller may include a plurality of controllers. In embodiments, a controller may be connected to a display, such as a touchscreen display.

Various examples/embodiments are described herein for various apparatuses, systems, and/or methods. Numerous specific details are set forth to provide a thorough understanding of the overall structure, function, manufacture, and use of the examples/embodiments as described in the specification and illustrated in the accompanying drawings. It will be understood by those skilled in the art, however, that the examples/embodiments may be practiced without such specific details. In other instances, well-known operations, components, and elements have not been described in detail so as not to obscure the examples/embodiments described in the specification. Those of ordinary skill in the art will understand that the examples/embodiments described and illustrated herein are non-limiting examples, and thus it can be appreciated that the specific structural and functional details disclosed herein may be representative and do not necessarily limit the scope of the embodiments.

Reference throughout the specification to "examples, "in examples," "with examples," "in the illustrated example," "various embodiments," "with embodiments," "in embodiments," "an embodiment," "with some configurations," "in some configurations," or the like, means that a particular feature, structure, or characteristic described in connection with the example/embodiment is included in at least one embodiment. Thus, appearances of the phrases "examples, "in examples," "with examples," "in the illustrated example," "in various embodiments," "with embodiments," "in embodiments," "an embodiment," "with some configurations," "in some configurations," or the like, in places throughout the specification are not necessarily all referring to the same embodiment. Furthermore, the particular features, structures, and/or characteristics may be combined in any suitable manner in one or more examples/embodiments. Thus, the particular features, structures, or characteristics illustrated or described in connection with one embodiment/ example may be combined, in whole or in part, with the features, structures, functions, and/or characteristics of one or more other embodiments/examples without limitation given that such combination is not illogical or non-functional. Moreover, many modifications may be made to adapt a particular situation or material to the teachings of the present disclosure without departing from the scope thereof. The word "exemplary" is used herein to mean "serving as a non-limiting example."

It should be understood that references to a single element are not necessarily so limited and may include one or more of such element, unless the context clearly indicates otherwise. Any directional references (e.g., plus, minus, upper, lower, upward, downward, left, right, leftward, rightward, top, bottom, above, below, vertical, horizontal, clockwise, and counterclockwise) are only used for identification purposes to aid the reader's understanding of the present disclosure, and do not create limitations, particularly as to the position, orientation, or use of examples/embodiments.

"One or more" includes a function being performed by one element, a function being performed by more than one element, e.g., in a distributed fashion, several functions being performed by one element, several functions being performed by several elements, or any combination of the above. The term "at least one of" in the context of, e.g., "at least one of A, B, and C" or "at least one of A, B, or C" includes only A, only B, only C, or any combination or subset of A, B, and C, including any combination or subset of one or a plurality of A, one or a plurality of B, and one or a plurality of C. A "set" of elements can include any number of one or more elements.

Although the terms first, second, etc. are, in some instances, used herein to describe various elements, these elements should not be limited by these terms. These terms are only used to distinguish one element from another. For example, a first element could be termed a second element, and, similarly, a second element could be termed a first element, without departing from the scope of the various described embodiments. The first element and the second element are both elements, but they are not the same element.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. The term "and/or" as used herein refers to and encompasses any and all possible combinations of one or more of the associated listed items. Uses of "and" and "or" are to be construed broadly (e.g., to be treated as "and/or"). For example and without limitation, uses of "and" do not necessarily require all elements or features listed, and uses of "or" are inclusive unless such a construction would be illogical. The terms "includes," "including." "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Joinder references (e.g., attached, coupled, connected, and the like) are to be construed broadly and may include intermediate members between a connection of elements, relative movement between elements, direct connections, indirect connections, fixed connections, movable connections, operative connections, indirect contact, and/or direct contact. As such, joinder references do not necessarily imply that two elements are directly connected/coupled and in fixed relation to each other. Connections of electrical components, if any, may include mechanical connections, electrical connections, wired connections, and/or wireless connections, among others. Uses of "e.g." and "such as" in the specification are to be construed broadly and are used to provide non-limiting examples of embodiments of the disclosure, and the disclosure is not limited to such examples.

While processes, systems, and methods may be described herein in connection with one or more steps in a particular sequence, such methods may be practiced with the steps in a different order, with certain steps performed simultaneously, with additional steps, and/or with certain described steps omitted.

As used herein, the term "if" is, optionally, construed to mean "when" or "upon" or "in response to determining" or "in response to detecting," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]," depending on the context.

References to a vehicle can include one or more of a variety of vehicles, including, without limitation, a passenger car (e.g., a sedan, a pickup truck, a sport utility vehicle, a crossover, etc.), a recreational vehicle, a truck, a bus, a plane, or a boat, among others.

All matter contained in the above description or shown in the accompanying drawings shall be interpreted as illustrative only and not limiting. Changes in detail or structure may be made without departing from the present disclosure.

A controller, an electronic control unit (ECU), an electronic controller a system, and/or a processor as described herein may include a conventional processing apparatus known in the art, which may be capable of executing preprogrammed instructions stored in an associated memory, all performing in accordance with the functionality described herein. To the extent that the methods described herein are embodied in software, the resulting software can be stored in an associated memory and can also constitute means for performing such methods. Such a system or processor may further be of the type having ROM, RAM, RAM and ROM, and/or a combination of non-volatile and volatile memory so that any software may be stored and yet allow storage and processing of dynamically produced data and/or signals.

An article of manufacture in accordance with this disclosure may include a non-transitory computer-readable storage medium having a computer program encoded thereon for implementing logic and other functionality described herein. The computer program may include code to perform one or more of the methods disclosed herein. Such embodiments may be configured to execute via one or more processors, such as multiple processors that are integrated into a single system or are distributed over and connected together through a communications network, and the communications network may be wired and/or wireless. Code for implementing one or more of the features described in connection with one or more embodiments may, when executed by a processor, cause a plurality of transistors to change from a first state to a second state. A specific pattern of change (e.g., which transistors change state and which transistors do not), may be dictated, at least partially, by the logic and/or code.

What is claimed is:

1. A method of operating an electrical assembly, the method comprising:
    sensing a current of a wire assembly electrically connecting a controller assembly with an electronic control unit (ECU), the wire assembly including a wire;
    sampling, at the controller assembly, a wire voltage of the wire to obtain a first set of voltage measurements;
    providing, via the controller assembly, a sampling request to the ECU;
    sampling, at the ECU and in accordance with receiving the sampling request, the wire voltage of the wire to obtain a second set of voltage measurements;
    providing the second set of voltage measurements to the controller assembly;
    compensating for a delay between the controller assembly and the ECU by shifting the first set of voltage measurements or the second set of voltage measurements by a time shift such that a difference in magnitude of the first set of voltage measurements and the second set of voltage measurements is minimized; and
    determining, at the controller assembly, a resistance of the wire assembly according to a quotient of the difference in magnitude divided by the current.

2. The method of claim 1, wherein the wire assembly includes a first electrical connector coupled to the wire and the controller assembly and a second electrical connector coupled to the wire and the ECU.

3. The method of claim 1, wherein the shifting includes shifting the second set of voltage measurements forward by the time shift.

4. The method of claim 1, wherein the sampling request includes a number of samples and a sampling rate.

5. The method of claim 4, wherein the sampling at the controller assembly includes obtaining the number of samples at the sampling rate; and
    the sampling at the ECU includes obtaining the number of samples at the sampling rate.

6. The method of claim 1, wherein the difference in magnitude is equal to a sum of differences in magnitude for each of the first set of voltage measurements relative to the second set of voltage measurements.

7. The method of claim 1, further comprising:
    comparing the resistance with a threshold resistance; and
    in accordance with determining the resistance is greater than or equal to the threshold resistance, opening a switch to disconnect the wire assembly from the controller assembly.

8. The method of claim 1, further comprising:
    repeating the sampling at the controller assembly to obtain a third set of voltage measurements, the sampling at the ECU to obtain a fourth set of voltage measurements; and
    compensating for a second delay between the controller assembly and the ECU by shifting the third set of voltage measurements or the fourth set of voltage measurements by a second time shift such that a second difference in magnitude of the third set of voltage measurements and the fourth set of voltage measurements is minimized.

9. The method of claim 8, further comprising:
    sensing a second current of the wire assembly; and
    determining, after compensating for the second delay, a second resistance of the wire assembly according to a second quotient of the second difference in magnitude divided by the second current.

10. The method of claim 9, wherein the second time shift is different than the time shift.

11. The method of claim 10, further comprising utilizing the determined resistance as an initial resistance; and
    comparing the initial resistance and the second resistance to determine if a resistance change has exceeded a resistance change threshold.

12. The method of claim 11, further comprising, in accordance with determining that the resistance change has exceeded the resistance change threshold, opening a switch of the controller assembly to disconnect the wire from the controller assembly.

13. The method of claim 12, wherein opening the switch disconnects the wire and the ECU from a battery.

14. The method of claim 9, further comprising:
    comparing the resistance to a threshold resistance;
    comparing the second resistance to the threshold resistance; and
    in accordance with determining the resistance or the second resistance is greater than or equal to the threshold resistance, opening a switch to disconnect the wire assembly from the controller assembly.

15. The method of claim 1, wherein the controller assembly and the ECU are not synchronized with each other.

16. An electrical assembly, comprising:
    a controller assembly including an electronic controller and a switch;
    an electronic control unit (ECU); and
    a wire assembly including a wire and electrically connecting the controller assembly with the ECU;
    wherein the controller assembly is configured to:
        obtain a current of the wire assembly;
        sample a wire voltage of the wire to obtain a first set of voltage measurements;
        provide a sampling request to the ECU; and
        compensate for a delay between the controller assembly and the ECU; and
    wherein the ECU is configured to:

sample, in accordance with receiving the sampling request, the wire voltage of the wire to obtain a second set of voltage measurements; and provide the second set of voltage measurements to the controller assembly.

17. The electrical assembly of claim 16, wherein compensating for the delay between the controller assembly and the ECU includes shifting the first set of voltage measurements or the second set of voltage measurements by a time shift such that a difference in magnitude of the first set of voltage measurements and the second set of voltage measurements is minimized.

18. The electrical assembly of claim 17, wherein the controller assembly is configured to determine whether the wire assembly is defective.

19. The electrical assembly of claim 18, wherein determining whether the wire assembly is defective includes determining a resistance of the wire assembly according to a quotient of the difference in magnitude divided by the current.

20. A vehicle, comprising:

a battery;

an electrical load; and the electrical assembly of claim 19;

wherein the controller assembly is electrically connected to the battery, and the ECU is electrically connected to the electrical load.

* * * * *